United States Patent [19]

Davison

[11] Patent Number: 5,040,241
[45] Date of Patent: Aug. 13, 1991

[54] CLOCK, RADIO, LIGHTER, LIGHT DISPLAY CABINET

[76] Inventor: Ronald Davison, 11 Church St., Cuba, N.Y. 14727

[21] Appl. No.: 355,325

[22] Filed: May 22, 1989

[51] Int. Cl.$^5$ .............................................. H04B 1/08
[52] U.S. Cl. .................................. 455/344; 455/347; 312/7.1
[58] Field of Search ............... 455/344, 347, 350, 351, 455/348; 181/144, 154; 312/7.1, 7.2, 223, 237; 361/422; D14/169, 170, 172–175

[56] References Cited

U.S. PATENT DOCUMENTS

| | | | |
|---|---|---|---|
| D. 121,858 | 8/1940 | Henderson | D14/176 |
| 2,065,367 | 12/1936 | Evans | 181/144 |
| 2,070,088 | 2/1937 | Montaruli | 312/7.1 |
| 2,109,431 | 2/1938 | McDonald | 181/154 |
| 2,571,903 | 10/1951 | Loewi et al. | 455/344 |
| 2,581,967 | 1/1952 | Mitchell | 455/347 |
| 3,179,891 | 4/1965 | Sharma | 455/351 |
| 4,089,044 | 5/1978 | Gatto et al. | 455/358 |
| 4,450,495 | 5/1984 | Naruki | 455/350 |

FOREIGN PATENT DOCUMENTS 59-86925  5/1984  Japan ................................ 455/347

Primary Examiner—Reinhard J. Eisenzopf
Assistant Examiner—Lisa Chevonel
Attorney, Agent, or Firm—Leon Gilden

[57] ABSTRACT

A radio construction is set forth including an upright cabinet including a plurality of spaced speakers positioned on each side wall of the cabinet including an overlying clock aligned with an underlying cigarette lighter, on/off switch, radio, and transparent panel. The transparent panel overlies a flashing light display including an independent alternating current power supply. The clock, cigarette lighter, and radio are each operative through a self-contained direct current battery to enable portability of the device upon removal of the sequencing light display from interiorly of the radio cabinet.

3 Claims, 1 Drawing Sheet

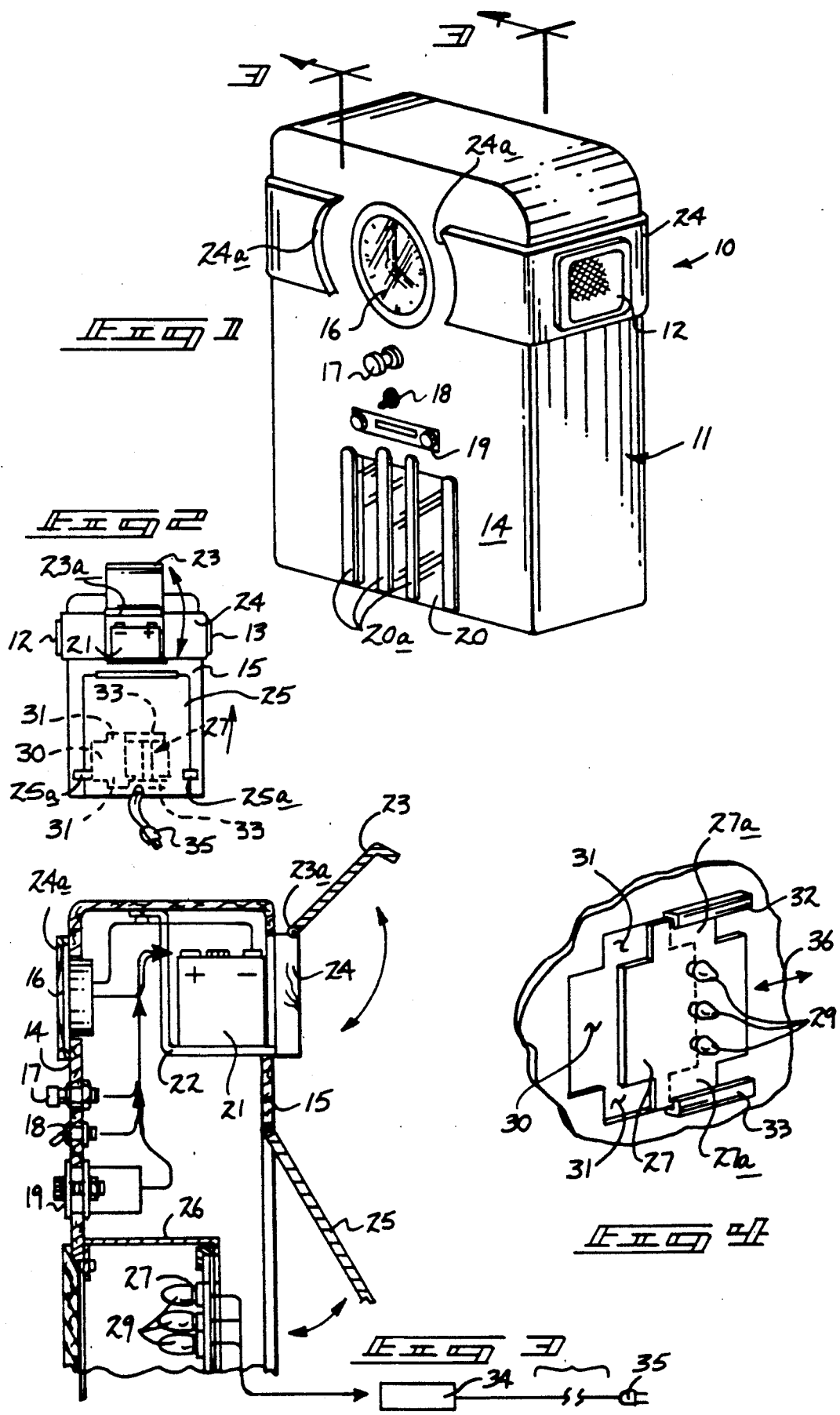

CLOCK, RADIO, LIGHTER, LIGHT DISPLAY CABINET

BACKGROUND OF THE INVENTION

1. Field of the Invention

The field of invention relates to radios, and more particularly pertains to a new and improved radio construction wherein the same includes a series of convenience and aesthetic features to enhance the enjoyment of the device by an individual.

2. Description of the Prior Art

The use of various radio constructions and their application for particular needs are well known in the prior art. The prior art includes U.S. pat. no. 2,109,431 to McDonald utilizing a radio construction wherein the speaker cabinet is pivotally mounted relative to a forward wall of the radio to reorient the speaker a desired.

U.S. pat. no. 2,065,367 to Evans sets forth a radio with a sound diffusing organization to effect a dispersion of sound about the radio.

U.S. pat. no. 2,070,088 to Montarull sets forth a radio cabinet utilizing lights and the like to enhance the enjoyment of the radio.

Similarly U.S. pat. design nos. 236,229 and 260,257 set forth various radio cabinetry construction in the prior art.

As such, it may be appreciated that there is a continuing need for a new and improved radio construction wherein the same addresses both the problems of providing a host of convenience features, as well as visually enhancing light means to promote enhanced enjoyment of a radio organization.

SUMMARY OF THE INVENTION

In view of the foregoing disadvantages inherent in the known types of radio constructions now present in the prior art, the present invention provides a radio construction wherein the same utilizes a series of personal comfort and visual aid devices to enhance enjoyment of an associated radio organization. As such, the general purpose of the present invention, which will be described subsequently in greater detail, is to provide a new and improved radio construction which has all the advantages of the prior art radio constructions and none of the disadvantages.

To attain this, the present invention comprises a radio construction wherein the same provides for a visually attractive clock, cigarette lighter, radio, and control switch, as well as an underlying aligned sequencing light compartment to enhance the enjoyment of the radio. The sequencing light compartment includes a panel removably mounted within an interior mounted support panel utilizing a plurality of aligned tracks to receive the light panel removably therein.

My invention resides not in any one of these features per se, but rather in the particular combination of all of them herein disclosed and claimed and it is distinguished from the prior art in this particular combination of all of its structures for the functions specified.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purpose of the present invention. It is important, therefore, that the claims be regarded as including such equivalent constructions insofar as they do not depart from the spirit and scope of the present invention.

Further, the purpose of the foregoing abstract is to enable the U.S Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is an object of the present invention to provide a new and improved radio construction wherein the same incorporates visual, as well as audible and personal comfort features, to enhance enjoyment of the associated radio organization.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is a frontal isometric illustration of the instant invention.

FIG. 2 is a rear orthographic view, taken in elevation, of the instant invention.

FIG. 3 is an orthographic view taken along the lines 3—3 of FIG. 1 in the direction indicated by the arrows.

FIG. 4 is an isometric illustration of the removable panel, as indicated by section 4 in FIG. 8.

DESCRIPTION OF THE PREFERRED EMBODIMENT

With reference now to the drawings, and in particular to FIGS. 1 to 4 thereof, a new and improved radio construction embodying the principles and concepts of the present invention and generally designated by the reference numeral 10 will be described.

More specifically, it will be noted that the radio construction 10 essentially comprises an elongate upright freestanding radio cabinet 11 including a first and second speaker 12 and 13 respectively oriented and secured through each of a side wall of the cabinet 11 directed through a molding panel 24. The molding panel 24 terminates at forward ends 24a in a surrounding protective relationship to a medially positioned clock 16. The clock 16 and associated devices are directed through a forward wall 14 of the cabinet 11 oriented parallel to a rear wall 15. The clock 16 overlies and is aligned with an underlying cigarette lighter 17, an on/off switch 18 and a conventional radio 19. Underlying the radio 19 is a transparent panel 20 provided with a series of protective strips 20a. Positioned adjacent the rear wall 15 is an "L" shaped shelf 22 supporting a nominal twelve volt direct current storage battery 21 accessible through an "L" shaped door 23 provided with an overlying spring biased hinge 23a to maintain the "L" shaped door 23 in a normally closed orientation and received within the molding panel 24 coextensive and orthogonally oriented relative to the rear wall 15 of the cabinet 11. Aligned with and underlying the "L" shaped door 23 is a bottom door 25 provided with spaced latches 25a along either lowermost side of the bottom door 25. The bottom door 25 provides access to an "L" shaped support panel 26 positioned and aligned with the transparent panel 20. The support panel 26 supports a flashing light array supported upon an elongate light panel 27. The light panel 27 is formed with aligned light panel tabs 27a directed outwardly of the light panel 27 at either end of the panel. The light panel 27 further includes a series of bulbs 29 operative through a sequencer 34 and in an associated alternating current power cord 35 to provide an aesthetically pleasing light array for use independently of or in combination with the radio for enhanced enjoyment during radio reception. Further, the presentation of a cigarette lighter and clock enables an individual to maintain enjoyment of the radio without recourse to other portions of a residence to seek such convenience features as the cigarette lighter and clock.

The independent power supply for the clock, cigarette lighter, and radio enables easy and convenient transport of the device independently of an alternating current power supply It is understood that the clock, cigarette lighter, and radio are each provided with a single electrical communication with a storage battery 21 with power directed selectively through the on/off switch 18 through a conventional series circuit. The alternating current power supply to actuate the sequencing lights 29 avoids unnecessary battery drain of the associated storage battery 21.

The light panel 27 is removably mounted within the "L" shaped support panel 26 wherein the light panel tabs 27a are directed through aligned tab openings 31 of an elongate opening 30. The elongate opening 30 and tab openings 31 enable access of the panel tabs 27a to a respective upper track 32 and a lower track 33 to slidably receive the light panel 27 upon sliding of the light panel 27 from a first to a second position, as illustrated by the arrow 36 in FIG. 4. The elongate opening 30 is of a complementary configuration to the light panel 27 to readily receive and align the panel 27 with the tracks 32 and 33.

As to the manner of usage and operation of the instant invention, the same should be apparent from the above disclosure, and accordingly no further discussion relative to the manner of usage and operation of the instant invention shall be provided.

With respect to the above description then, it is to be realized that the optimum dimensional relationships for the parts of the invention, to include variations in size, materials. shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A radio construction comprising,
   an elongate vertically positioned cabinet including spaced side walls, a forward wall, and a rear wall spaced from the forward wall, with a top surface defining an enclosure, and
   a molding panel coextensively and integrally secured to the rear wall, spaced side walls, and extending about the forward wall and terminating in spaced molding panel ends on the forward wall to define a forward space medially of the forward wall, and
   a clock protectively recessed within the forward space between the molding panel ends, and
   a radio receiving unit with an on/off switch operative to selectively electrically switch the radio on or off with the switch aligned with and positioned under the radio receiving unit and the clock, and
   a light display visually directed through and positioned behind a transparent panel underlying the radio, and
   including a plurality of speakers with a speaker directed through the molding panel on each side wall of the cabinet, and
   further including an "L" shaped door overlying a space through the molding panel, the "L" shaped door hingedly mounted to the molding panel medially of the rear wall, and an "L" shaped shelf supportingly mounting a direct current storage battery therewithin wherein the storage battery provides electrical current for the clock and the radio, and further including a cigarette lighter in electrical communication with the storage battery, and
   wherein the "L" shaped door includes an elongate hinge, and the elongate hinge is spring biased to maintain the "L" shaped door in a closed orientation overlying the space, and
   further including a bottom door hingedly mounted overlying an interior of the cabinet, and positioned rearwardly of the light display to provide access of the light display through the bottom door.

2. A radio construction as set forth in claim 1 wherein the light display includes a light panel formed with an upper and lower tab directed outwardly of the panel, and each tab slidably receivable within a respective upper and lower track formed within an "L" shaped panel aligned with the transparent panel.

3. A radio construction as set forth in claim 2 wherein the "L" shaped panel includes an elongate opening including elongate tab openings for receiving the panel tabs and wherein each of the tab openings are positioned adjacent the upper and lower track to slidably receive the light panel therein, and the elongate opening of a complementary configuration to the light panel to accept the light panel therein adjacent the upper and lower tracks.

* * * * *